US010672883B2

(12) United States Patent
Ren et al.

(10) Patent No.: US 10,672,883 B2
(45) Date of Patent: Jun. 2, 2020

(54) MIXED TRENCH JUNCTION BARRIER SCHOTTKY DIODE AND METHOD FABRICATING SAME

(71) Applicants: Na Ren, Los Angeles, CA (US); Zheng Zuo, Los Angeles, CA (US); Ruigang Li, Los Angeles, CA (US)

(72) Inventors: Na Ren, Los Angeles, CA (US); Zheng Zuo, Los Angeles, CA (US); Ruigang Li, Los Angeles, CA (US)

(73) Assignee: AZ Power, Inc, Culver City, CA (US)

( * ) Notice: Subject to any disclaimer, the term of this patent is extended or adjusted under 35 U.S.C. 154(b) by 0 days.

(21) Appl. No.: 16/161,379

(22) Filed: Oct. 16, 2018

(65) Prior Publication Data

US 2020/0119158 A1    Apr. 16, 2020

(51) Int. Cl.

| | |
|---|---|
| H01L 21/02 | (2006.01) |
| H01L 21/04 | (2006.01) |
| H01L 29/06 | (2006.01) |
| H01L 29/872 | (2006.01) |
| H01L 29/66 | (2006.01) |
| H01L 29/16 | (2006.01) |
| H01L 29/417 | (2006.01) |
| H01L 29/167 | (2006.01) |

(52) U.S. Cl.
CPC ........ *H01L 29/6606* (2013.01); *H01L 21/046* (2013.01); *H01L 21/0485* (2013.01); *H01L 21/0495* (2013.01); *H01L 29/167* (2013.01); *H01L 29/1608* (2013.01); *H01L 29/417* (2013.01); *H01L 29/66143* (2013.01); *H01L 29/872* (2013.01)

(58) Field of Classification Search
CPC .......... H01L 21/8213; H01L 21/02296; H01L 21/02227; H01L 21/02351; H01L 21/02378; H01L 2924/02378; H01L 29/47; H01L 29/0619; H01L 29/0657; H01L 21/02529; H01L 21/0495
See application file for complete search history.

(56) References Cited

U.S. PATENT DOCUMENTS

| | | | |
|---|---|---|---|
| 6,570,185 B1 * | 5/2003 | Tan ...................... | H01L 29/0619 257/77 |
| 2012/0273802 A1 * | 11/2012 | Zhang ................. | H01L 29/0615 257/77 |
| 2017/0005183 A1 * | 1/2017 | Bhalla ................ | H01L 29/42304 |
| 2018/0358431 A1 * | 12/2018 | Kagawa .............. | H01L 29/1045 |
| 2018/0358478 A1 * | 12/2018 | Ren ....................... | H01L 29/872 |

* cited by examiner

*Primary Examiner* — Caridad Everhart
(74) *Attorney, Agent, or Firm* — Che-Yang Chen; Law Office of Michael Chen

(57) ABSTRACT

A method for manufacturing a SiC mixed trench Schottky diode may include steps of providing a substrate and an epitaxial layer on top of the substrate; forming a plurality of trenches on a surface of the epitaxial layer; conducting ion implantation at a bottom portion of each trench; conducting ion implantation at sidewalls of each trench; forming an ohmic contact metal at a bottom portion of the Schottky diode; forming a Schottky contact metal on top of the epitaxial layer and in the trenches. In one embodiment, the substrate is an N+ type SiC and the epitaxial layer is an N− type SiC. In another embodiment, the step of forming a plurality of trenches on a surface of the epitaxial layer may include the step of etching the surface of the epitaxial layer by either dry etching or wet etching.

17 Claims, 13 Drawing Sheets

US 10,672,883 B2

MIXED TRENCH JUNCTION BARRIER SCHOTTKY DIODE AND METHOD FABRICATING SAME

FIELD OF THE INVENTION

The present invention relates to a Schottky diode, and more particularly to a mixed trench type junction barrier Scthottky diode.

BACKGROUND OF THE INVENTION

Silicon carbide (SiC) diodes have been widely recognized for their significant advantages in power applications, especially under high voltage/temperature conditions. In general, SiC Schottky diodes are advantageous because of low onset voltage (as compared with that of SiC p-n diodes) and no reverse recovery. However, reverse leakage current of a planar Schottky diode can be significantly larger under high blocking voltage, caused by tunneling effects at the Schottky interface.

Junction barrier Schottky (JBS) diode structure was proposed to address this problem, which combines the advantages of Schottky junction and PN junction diodes. In JBS structure, a plurality of P regions are disposed between Schottky regions. The depletion layer diffuses from PN junction to exhibit pinch-off below the Schottky contact in reverse blocking mode, which can provide an electric field shielding effect. As a result, the electric field strength at the Schottky interface can be reduced and the diode leakage current can be decreased accordingly.

The electric field shielding effect can be enhanced by increasing the PN junction depth. However, due to the strong lattice of SiC material, the ion implantation depth is usually restricted to less than 1 µm. Recently, a trench type junction barrier Schottky diode structure with trenches totally surrounded by P regions is proposed as shown in FIG. 4. With the introduction of the trench, P-type ions can be implanted into the sidewall and bottom of the trench, and the resulting PN junction can be deeper than 1 µm. However, the channel resistance between adjacent deep P regions will be increased since only the upper Schottky contact between the P regions can conduct current in the normal forward manner. As a result, the forward performance of the device will be sacrificed. Therefore, there remains a need for a new and improved trench type junction barrier Schottky diode to overcome the problems stated above.

SUMMARY OF THE INVENTION

In one aspect, a SiC mixed trench junction barrier Schottky diode may include a substrate, an epitaxial layer, a plurality of trenches, a P-type implant, a first Schottky contact metal, an ohmic contact metal, an N-type implant, and a second Schottky contact metal.

In one embodiment, the ohmic contact metal can be nickel, silver or platinum. The substrate 1 produced from $N^+$ type SiC is disposed on the top of the ohmic contact metal, and the epitaxial layer produced from $N^-$ type SiC can be disposed on top of the substrate. The trench can be produced by etching the epitaxial layer. In one embodiment, the etching can be done by either dry etching or wet etching. The depth of the trench is about 1 to 50000 angstrom.

The P-type implant is produced by ion implantation into a bottom portion of the trench with P-type materials such as boron or aluminum. In one embodiment, the thickness of the implant is about 1 to 10000 angstrom. The N-type implant is produced by ion implantation into the trench sidewall from N-type material such as nitrogen or phosphorus. In one embodiment, the thickness of the implant is also about 1 to 10000 angstrom.

The first Schottky contact metal is located on top of the epitaxial layer and a Schottky junction can be formed between the first Schottky contact metal and the epitaxial layer. The second Schottky contact metal is filled into the trench. A Schottky junction can be formed between the trench and the epitaxial layer.

In another aspect, a method for manufacturing a SiC mixed trench Schottky diode may include steps of providing a substrate and an epitaxial layer on top of the substrate; forming a plurality of trenches on a surface of the epitaxial layer; conducting ion implantation at a bottom portion of each trench; conducting ion implantation at sidewalls of each trench; forming an ohmic contact metal at a bottom portion of the Schottky diode; forming a Schottky contact metal on top of the epitaxial layer and in the trenches.

In one embodiment, the substrate is an $N^+$ type SiC and the epitaxial layer is an $N^-$ type SiC. In another embodiment, the step of forming a plurality of trenches on a surface of the epitaxial layer may include the step of etching the surface of the epitaxial layer by either dry etching or wet etching. The depth of the trench 3 is about 1 to 50000 angstrom.

In a further embodiment, the step of conducting ion implantation at a bottom portion of each trench may include a step of implanting P-type materials such as boron or aluminum into the bottom portion of the trench. The thickness of the P-type implant is about 1 to 10000 angstrom In still a further embodiment, the step of conducting ion implantation at sidewalls of each trench may include a step of implanting N-type materials such as nitrogen or phosphorus into at the sidewalls of the trench. The thickness of the N-type implant is about 1 to 10000 angstrom

DETAILED DESCRIPTION OF THE INVENTION

Figure 1:
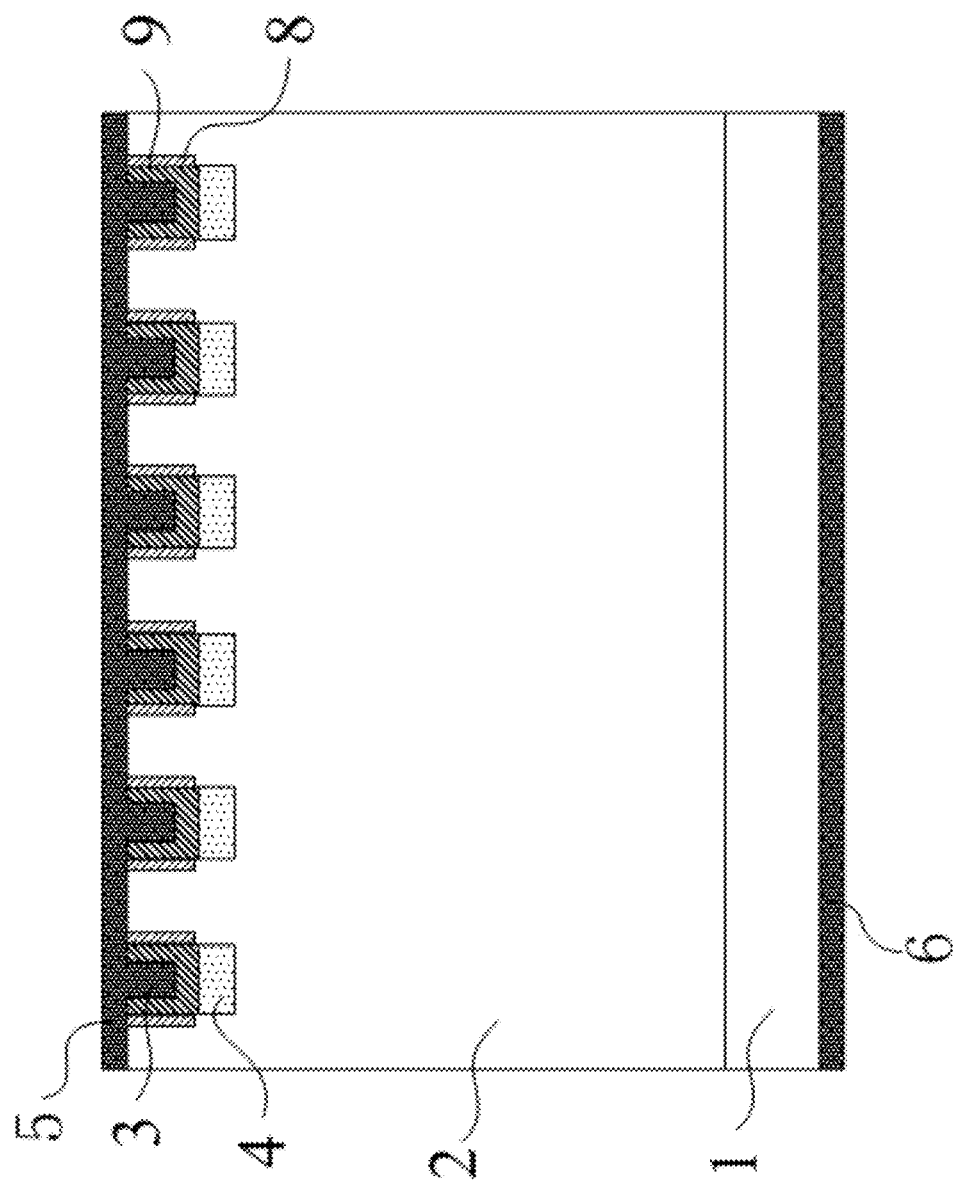
FIG. 1 is a cross-sectional view of a SiC mixed trench junction barrier Schottky diode in the present invention.
Figure 2A:
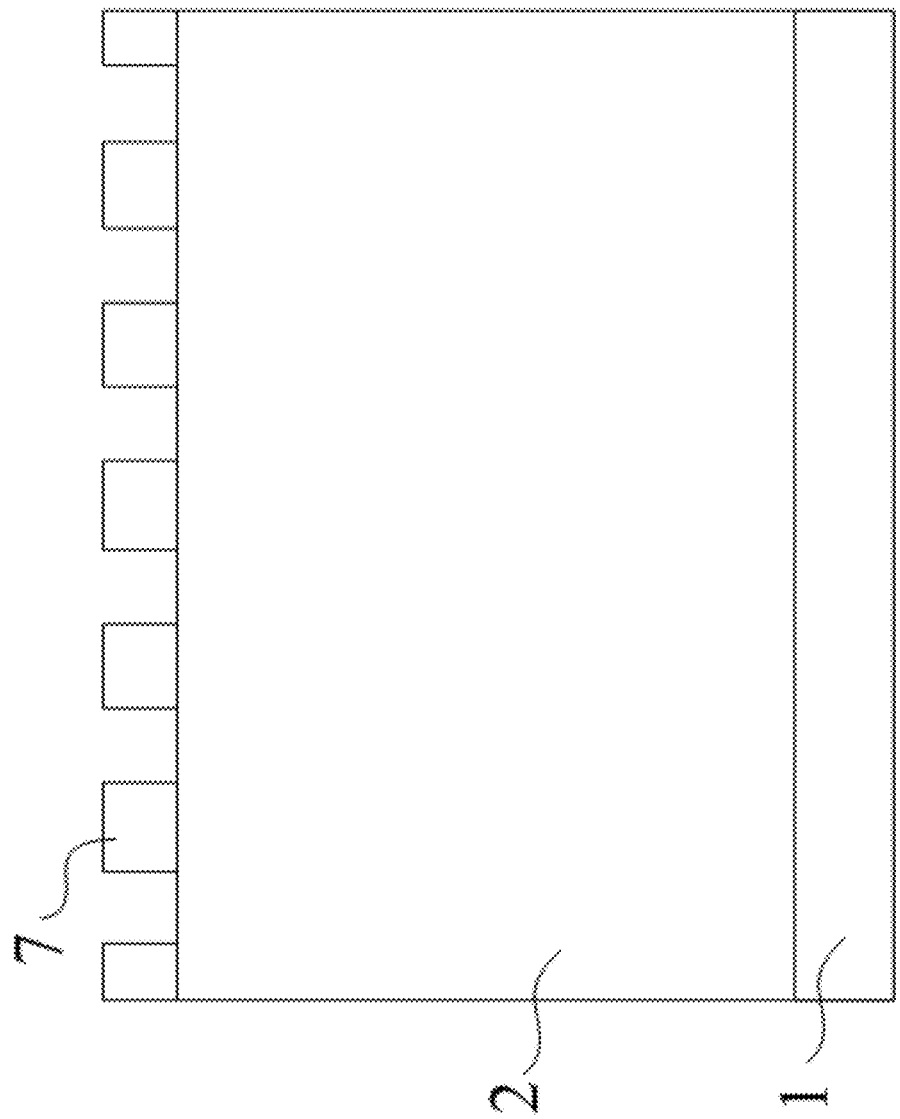
FIGS. 2A-2B illustrates a cross-sectional view of a plurality of trenches on the surface of the epitaxial layer of the SiC mixed trench junction barrier Schottky diode in the present invention.
Figure 2B:
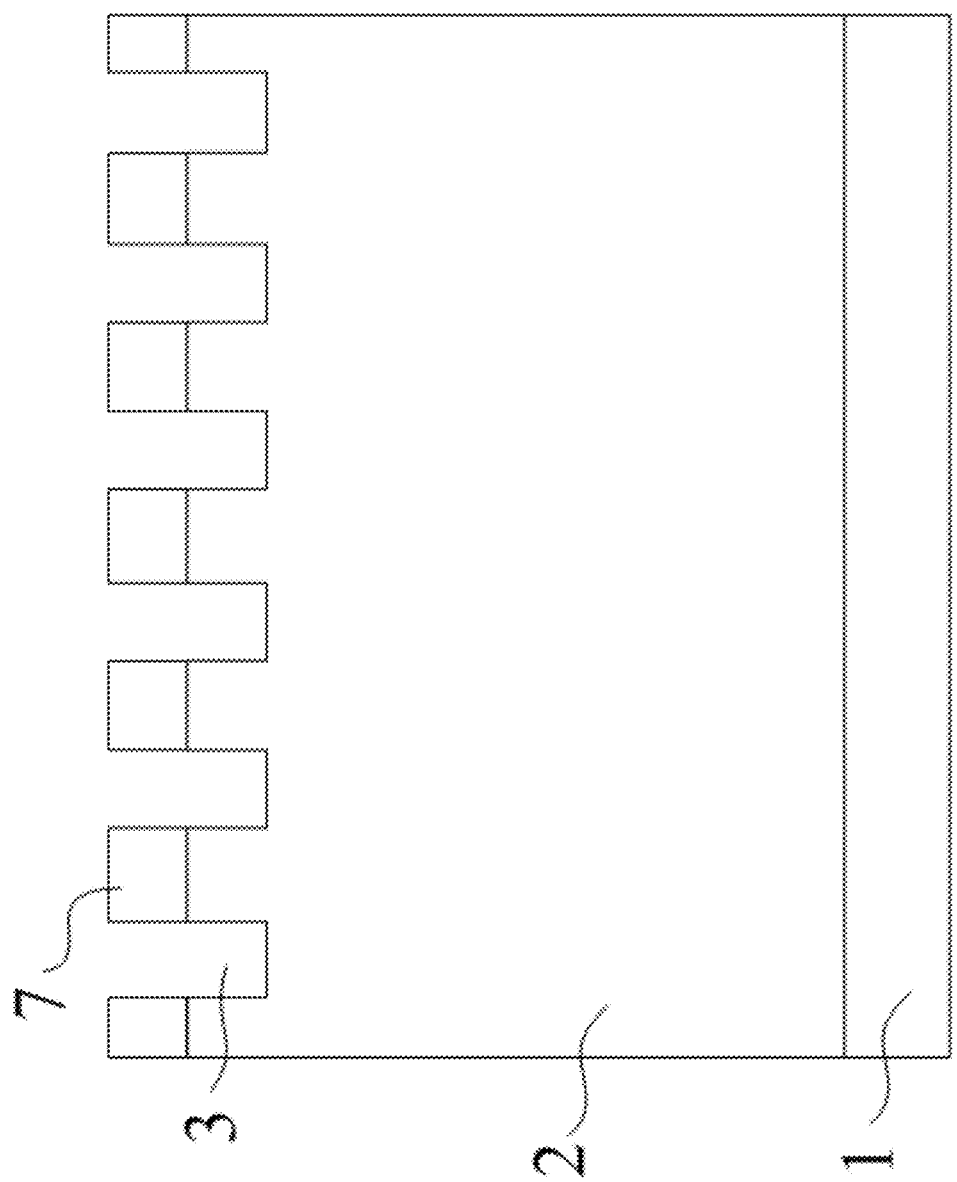
Figure 2C:
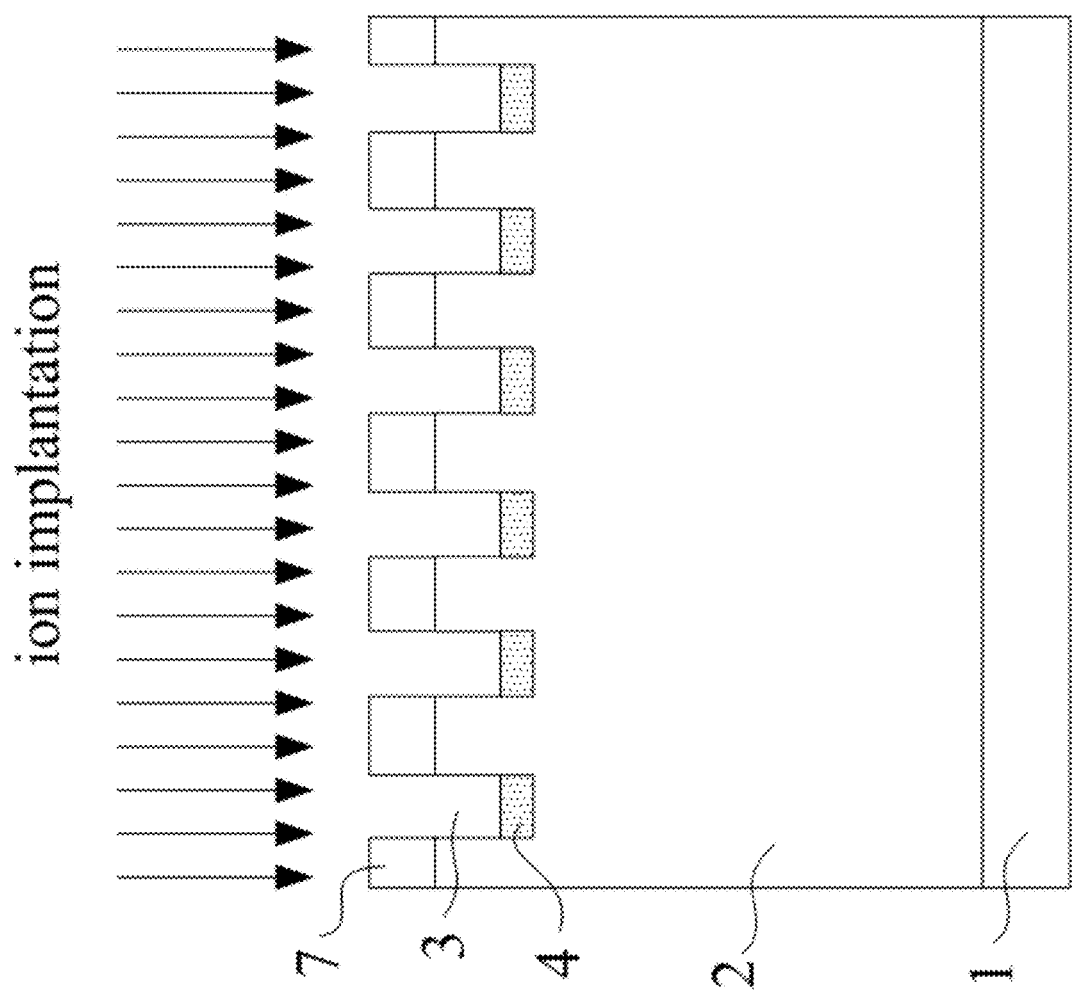
FIG. 2C illustrates a cross-sectional view of implantation at the bottom portion of each trench of the SiC mixed trench junction barrier Schottky diode in the present invention.
Figure 2D:
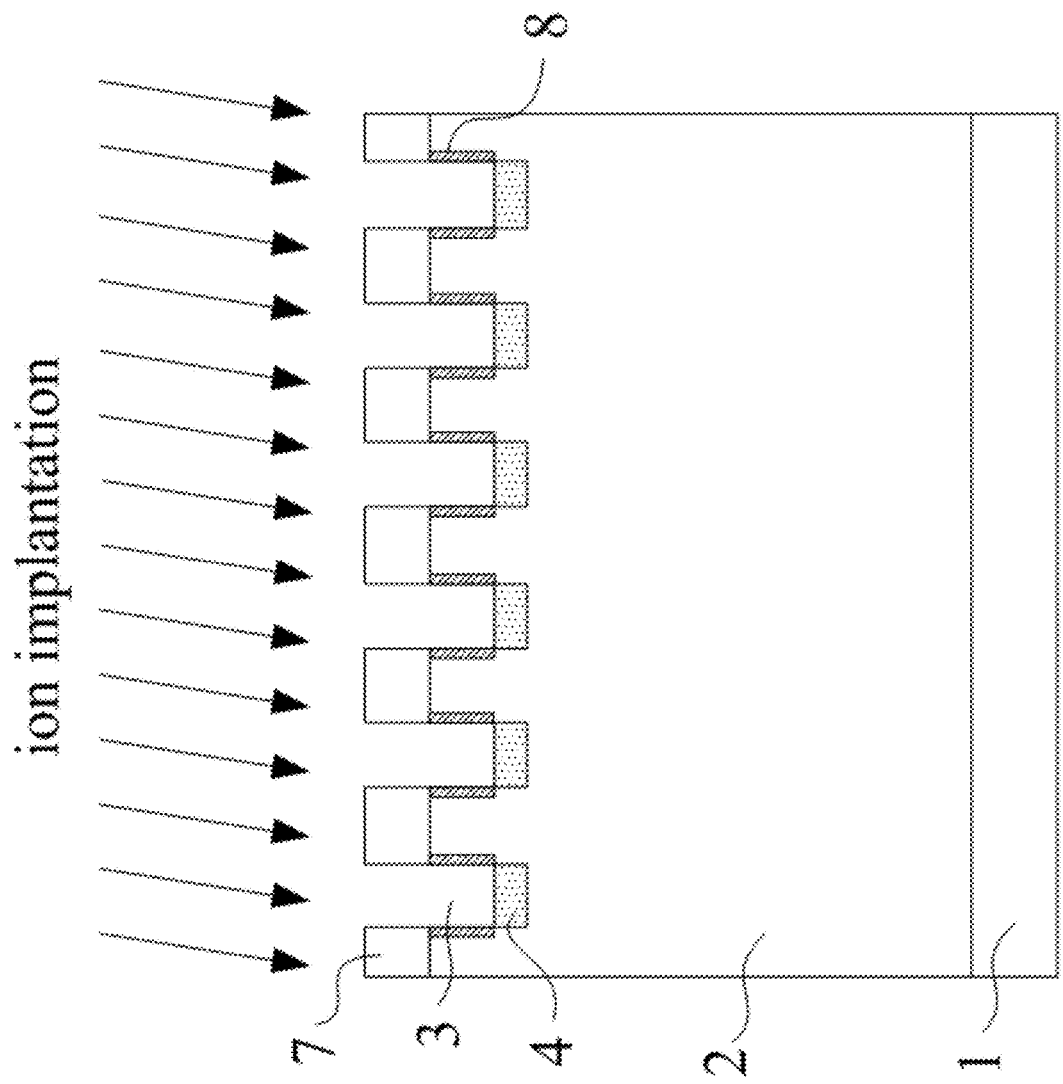
FIG. 2D illustrates a cross-sectional view of implantation at the sidewalls of each trench of the SiC mixed trench junction barrier Schottky diode in the present invention.
Figure 2E:
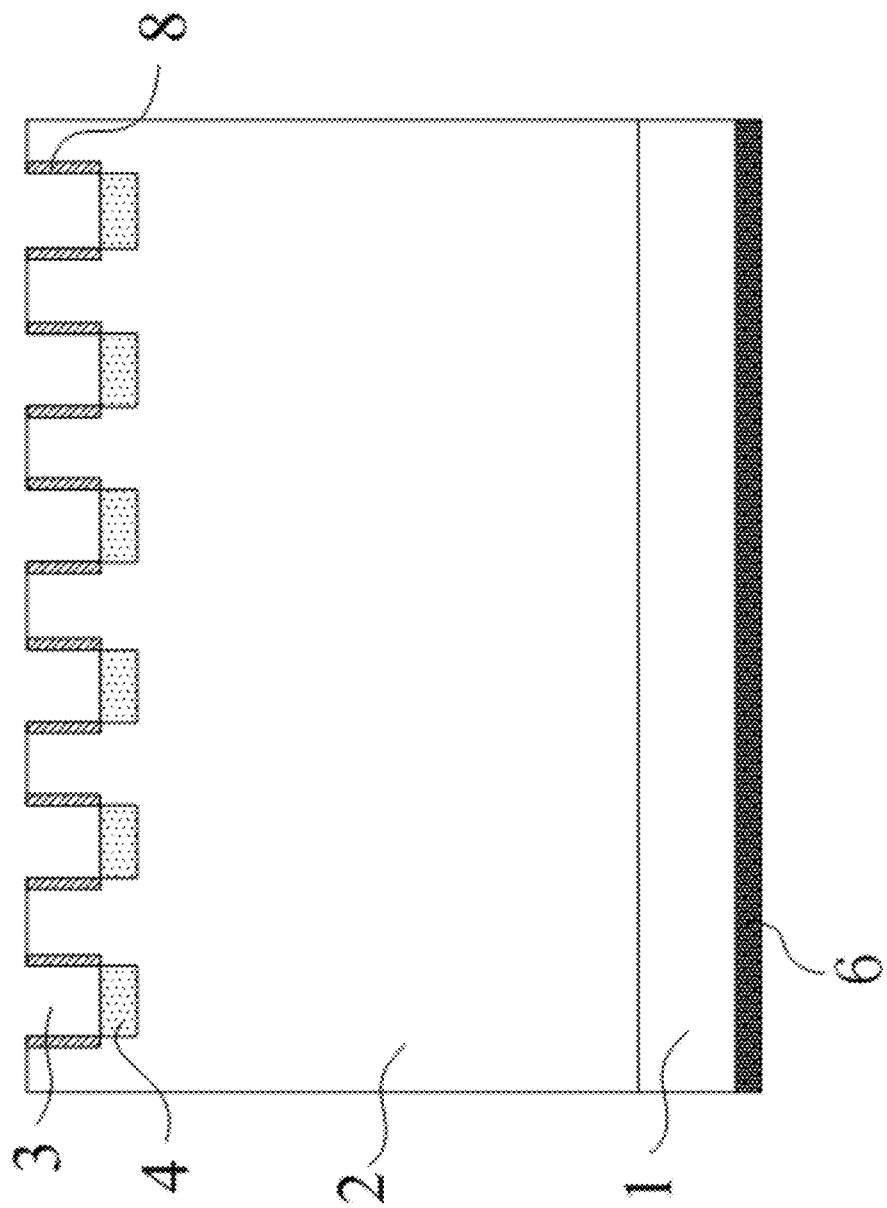
FIG. 2E illustrates a cross-sectional view of the trenches after implantation of the SiC mixed trench junction barrier Schottky diode in the present invention.
Figure 2F:
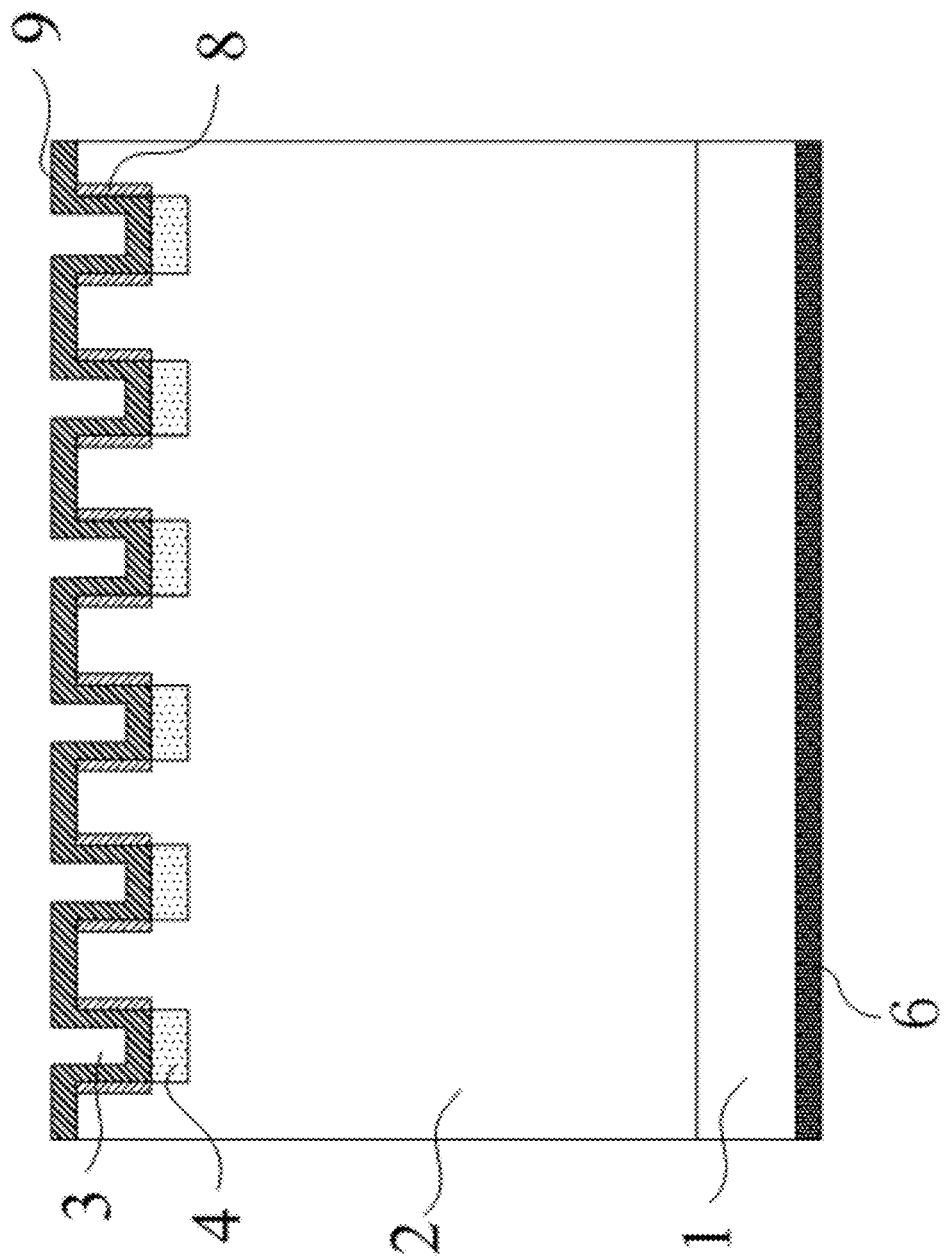
FIGS. 2F-2J illustrate a process flow of forming a Schottky contact metal in the trenches and on the top surface of the SiC mixed trench junction barrier Schottky diode in the present invention.
Figure 2G:
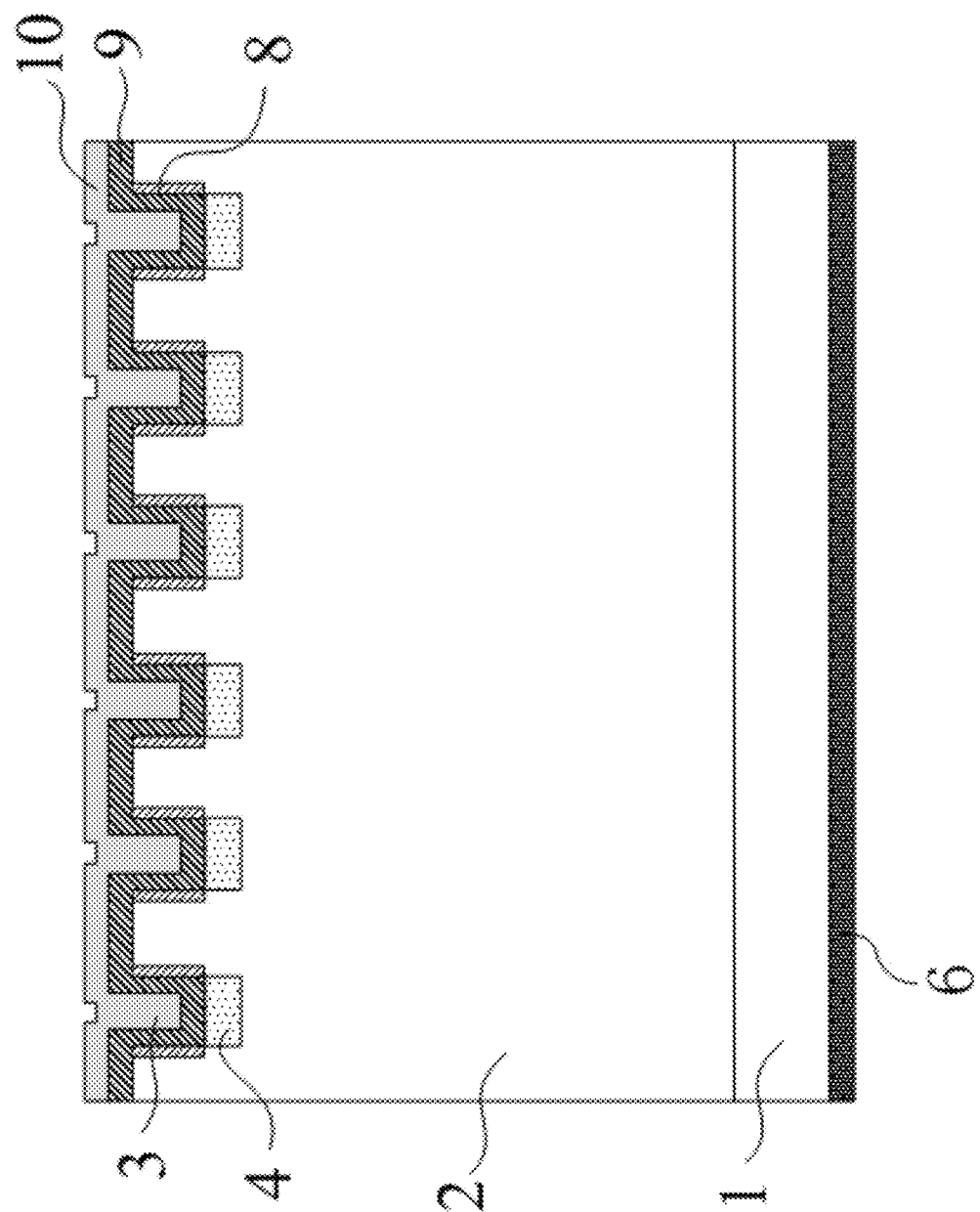
Figure 2H:
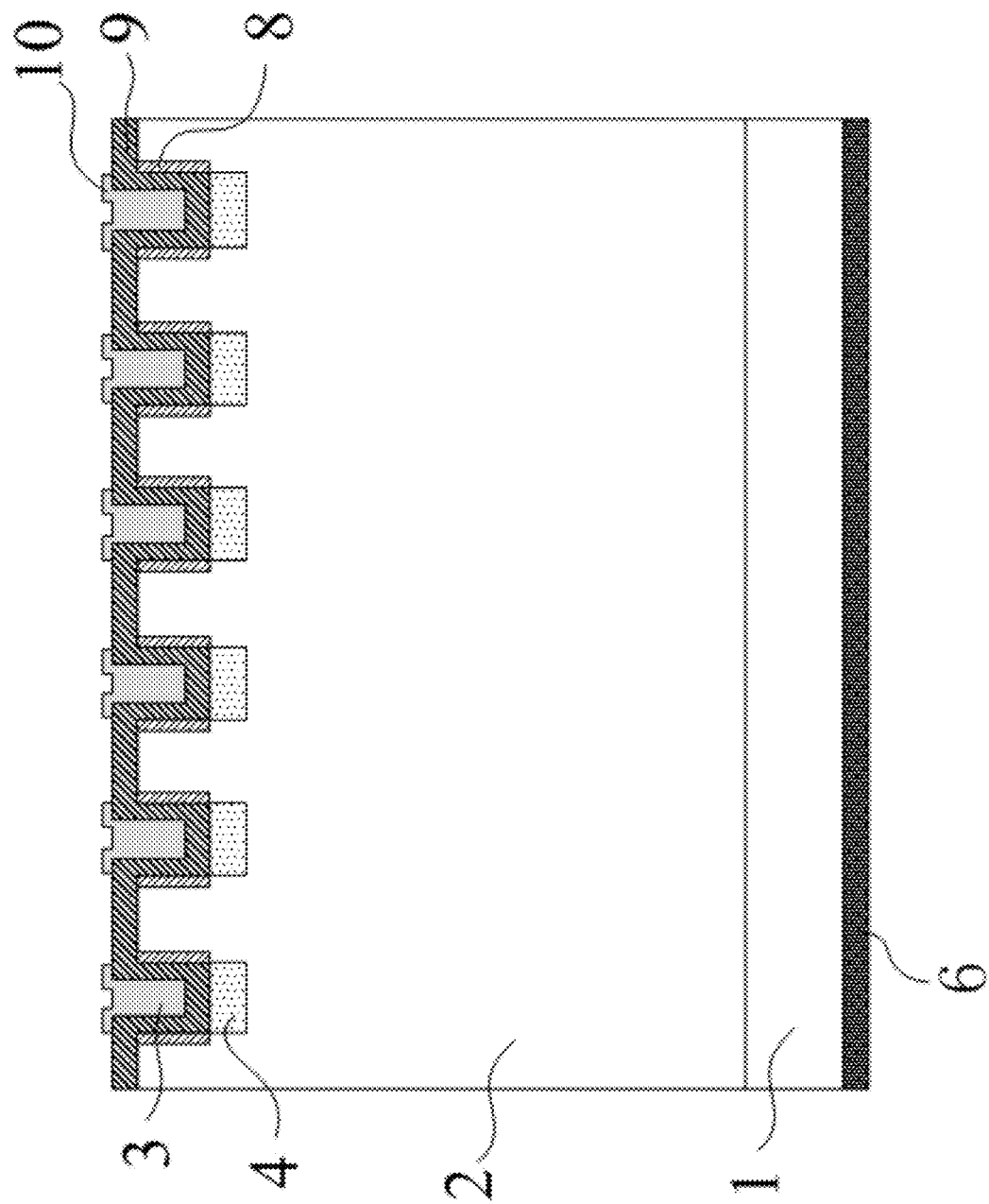
Figure 2I:
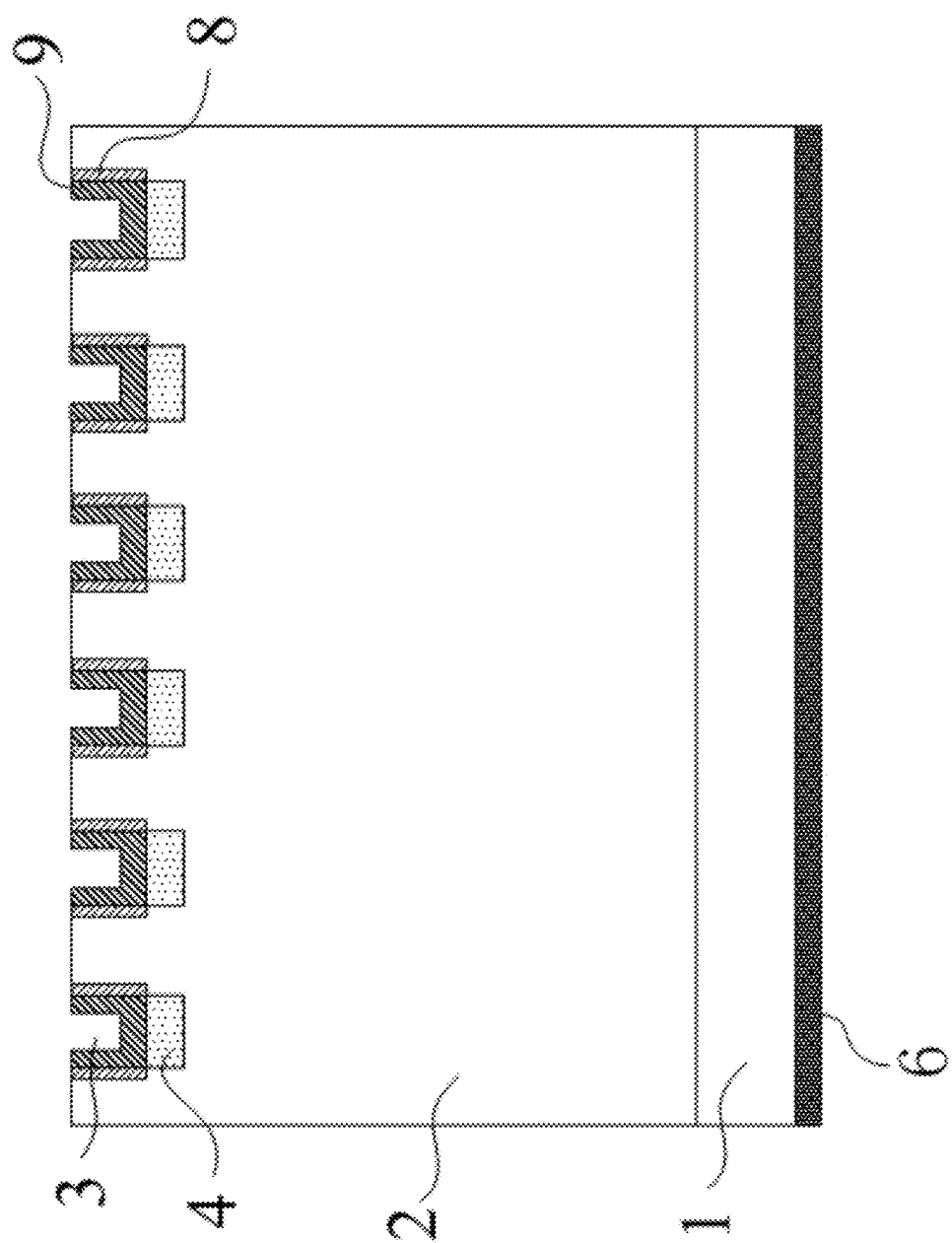
Figure 2J:
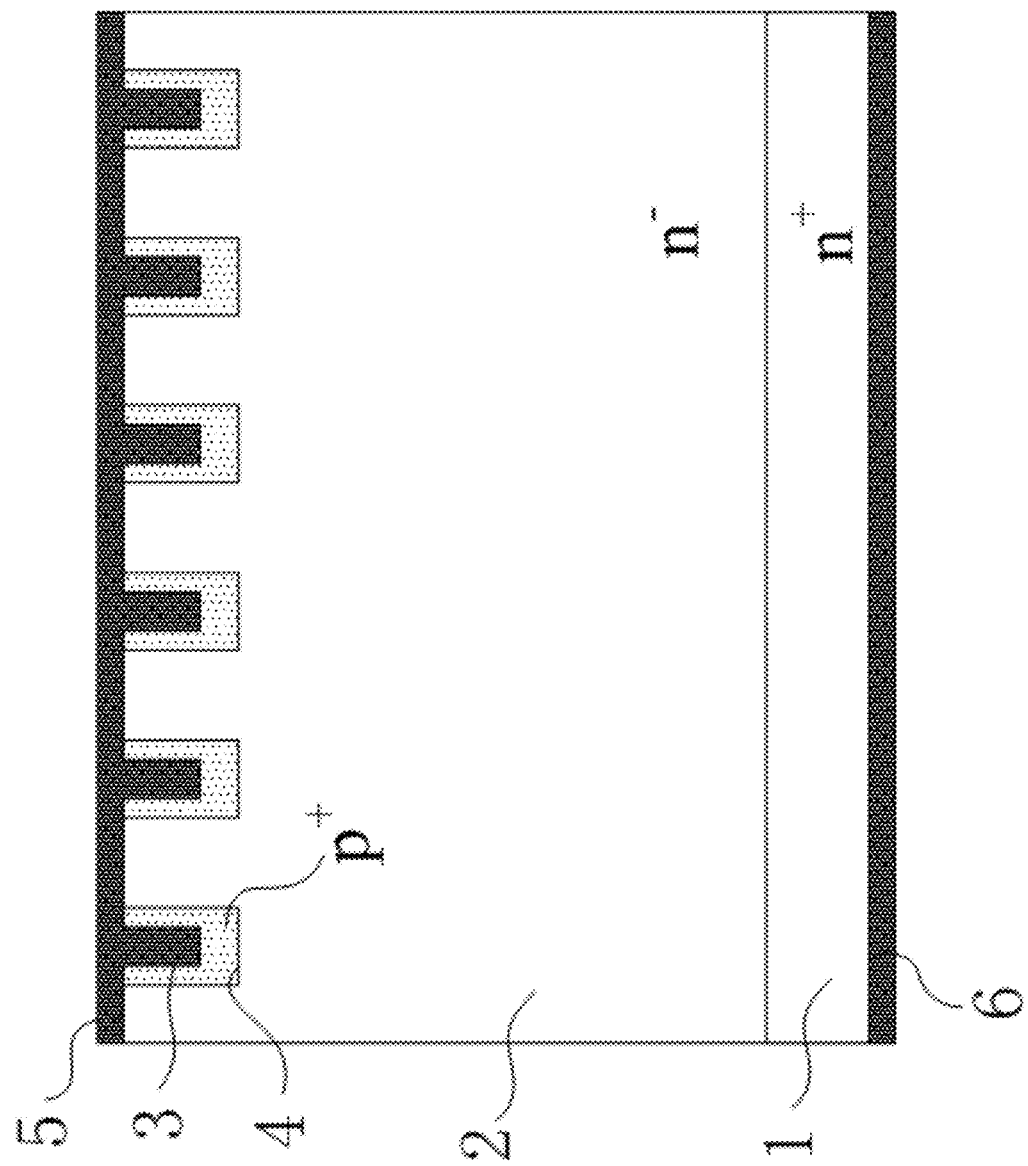

The detailed description set forth below is intended as a description of the presently exemplary device provided in accordance with aspects of the present invention and is not intended to represent the only forms in which the present invention may be prepared or utilized. It is to be understood, rather, that the same or equivalent functions and components may be accomplished by different embodiments that are also intended to be encompassed within the spirit and scope of the invention.

Unless defined otherwise, all technical and scientific terms used herein have the same meaning as commonly understood to one of ordinary skill in the art to which this invention belongs. Although any methods, devices and materials similar or equivalent to those described can be used in the practice or testing of the invention, the exemplary methods, devices and materials are now described.

All publications mentioned are incorporated by reference for the purpose of describing and disclosing, for example, the designs and methodologies that are described in the publications that might be used in connection with the presently described invention. The publications listed or discussed above, below and throughout the text are provided solely for their disclosure prior to the filing date of the present application. Nothing herein is to be construed as an admission that the inventors are not entitled to antedate such disclosure by virtue of prior invention.

As used in the description herein and throughout the claims that follow, the meaning of "a", "an", and "the" includes reference to the plural unless the context clearly dictates otherwise. Also, as used in the description herein and throughout the claims that follow, the terms "comprise or comprising", "include or including", "have or having", "contain or containing" and the like are to be understood to be open-ended, i.e., to mean including but not limited to. As used in the description herein and throughout the claims that follow, the meaning of "in" includes "in" and "on" unless the context clearly dictates otherwise.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments. As used herein, the term "and/or" includes any and all combinations of one or more of the associated listed items.

In one aspect, referring to FIGS. 1 and 2A to 2J for a cross sectional view of a SiC mixed trench junction barrier Schottky diode, which may include a substrate 1, an epitaxial layer 2, a plurality of trenches 3, a P-type implant 4, a first Schottky contact metal 5, an ohmic contact metal 6, an N-type implant 8, and a second Schottky contact metal 9.

In one embodiment, the ohmic contact metal 6 can be nickel, silver or platinum. The substrate 1 produced from $N^+$ type SiC is disposed on the top of the ohmic contact metal 6, and the epitaxial layer 2 produced from $N^-$ type SiC can be disposed on top of the substrate 1. The trench 3 can be produced by etching the epitaxial layer 2. In one embodiment, the etching can be done by either dry etching or wet etching. The depth of the trench 3 is about 1 to 50000 angstrom.

The P-type implant 4 is produced by ion implantation into a bottom portion of the trench 3 with P-type materials such as boron or aluminum. In one embodiment, the thickness of the implant 4 is about 1 to 10000 angstrom. The N-type implant 8 is produced by ion implantation into the trench sidewall from N-type material such as nitrogen or phosphorus. In one embodiment, the thickness of the implant 8 is also about 1 to 10000 angstrom.

The first Schottky contact metal 5 is located on top of the epitaxial layer 2 and a Schottky junction can be formed between the first Schottky contact metal 5 and the epitaxial layer 2. The second Schottky contact metal 9 is filled into the trench 3. A Schottky junction can be formed between the trench 3 and the epitaxial layer 2.

Figure 3:
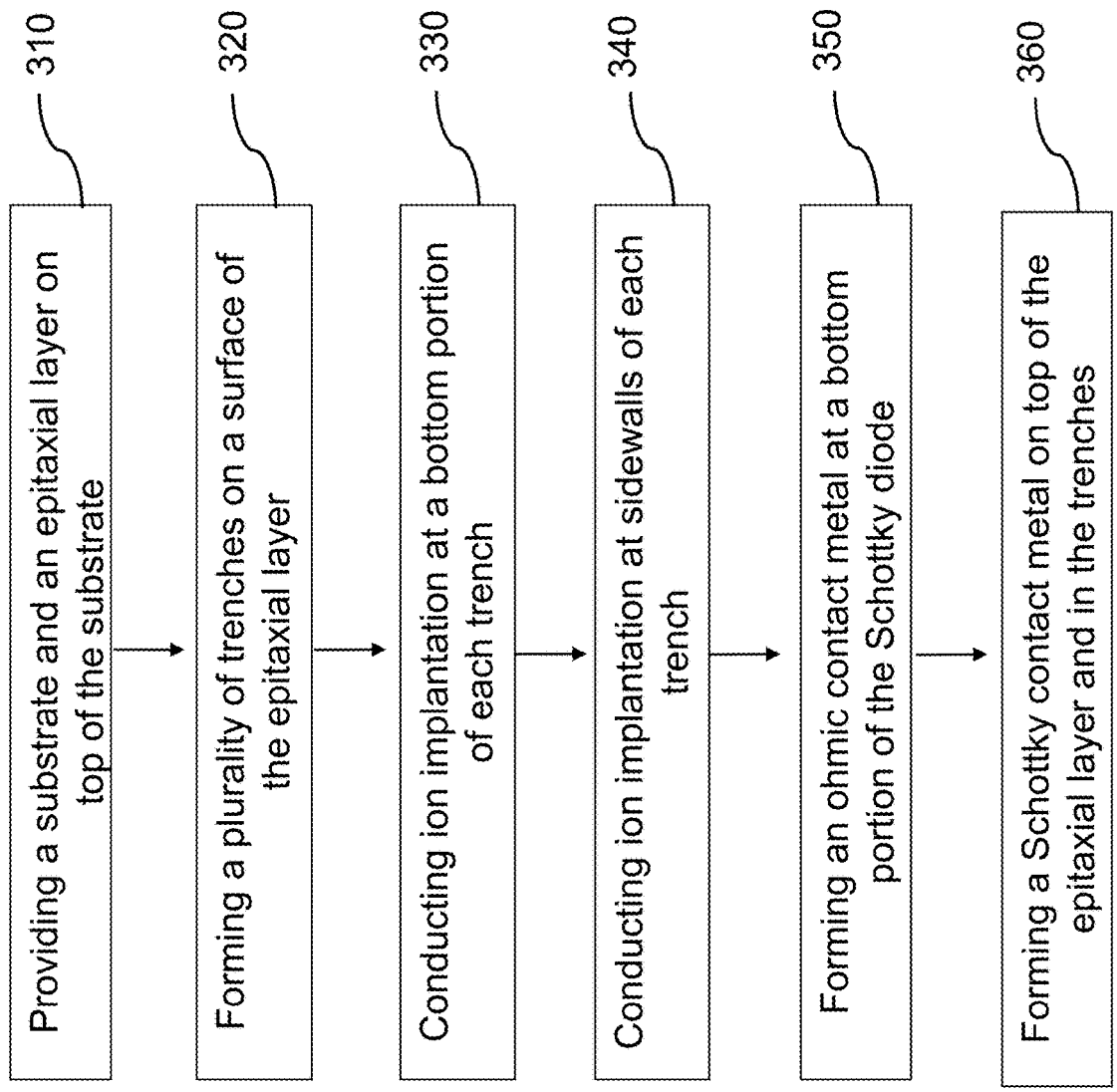
FIG. 3 illustrates a method for manufacturing a SiC mixed trench Schottky diode in the present invention.
Figure 4:
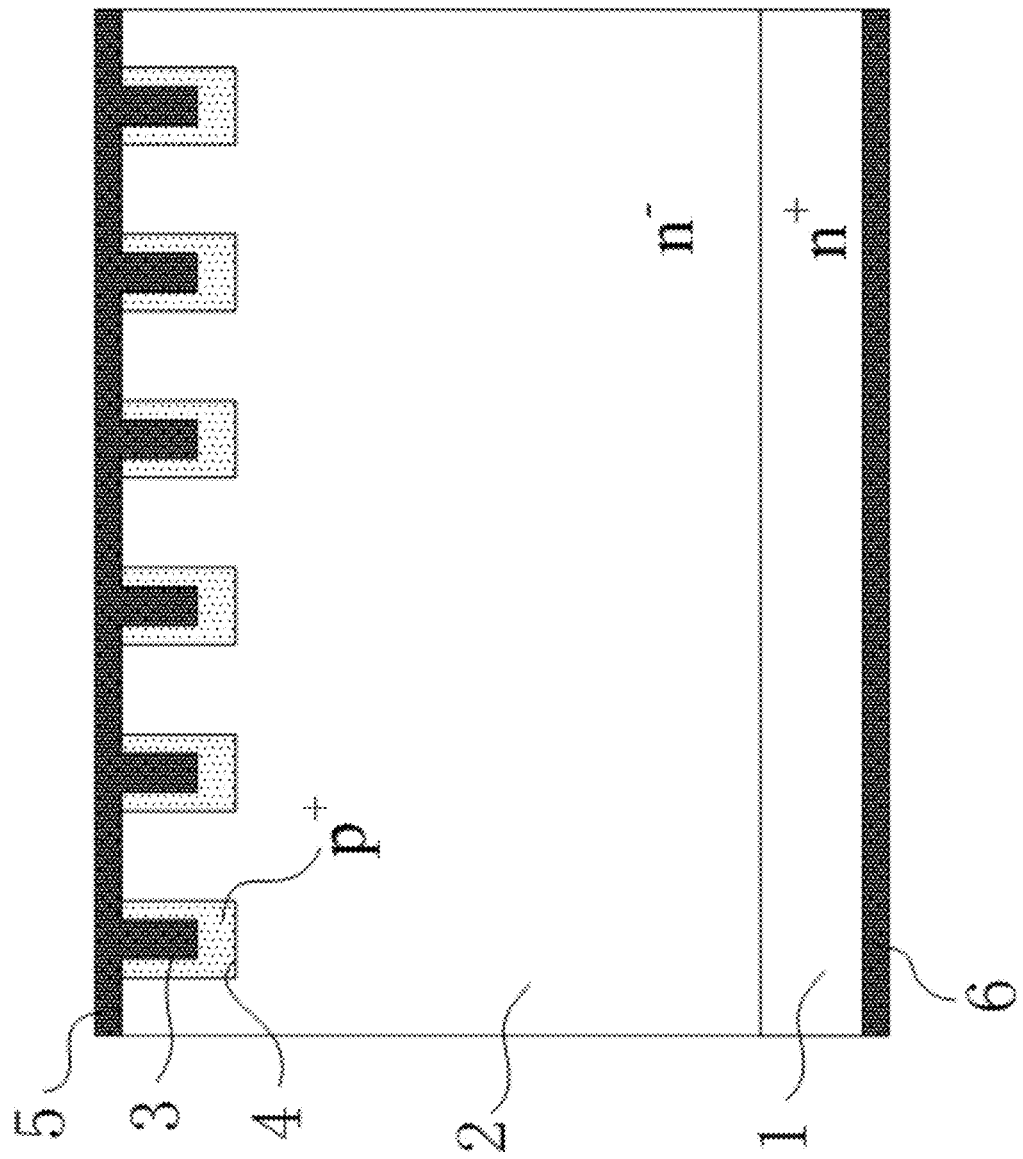
FIG. 4 is a prior art.

In another aspect, as shown in FIG. 3, a method for manufacturing a SiC mixed trench Schottky diode may include steps of providing a substrate and an epitaxial layer on top of the substrate 310; forming a plurality of trenches on a surface of the epitaxial layer 320; conducting ion implantation at a bottom portion of each trench 330; conducting ion implantation at sidewalls of each trench 340; forming an ohmic contact metal at a bottom portion of the Schottky diode 350; forming a Schottky contact metal on top of the epitaxial layer and in the trenches 360.

In one embodiment, the substrate is an $N^+$ type SiC and the epitaxial layer is an $N^-$ type SiC. In another embodiment, the step of forming a plurality of trenches on a surface of the epitaxial layer may include the step of etching the surface of the epitaxial layer by either dry etching or wet etching. The depth of the trench 3 is about 1 to 50000 angstrom.

In a further embodiment, the step of conducting ion implantation at a bottom portion of each trench may include a step of implanting P-type materials such as boron or aluminum into the bottom portion of the trench. The thickness of the P-type implant is about 1 to 10000 angstrom In still a further embodiment, the step of conducting ion implantation at sidewalls of each trench may include a step of implanting N-type materials such as nitrogen or phosphorus into at the sidewalls of the trench. The thickness of the N-type implant is about 1 to 10000 angstrom. In still a further embodiment, the ohmic contact metal in step 350 can be nickel, silver or platinum.

Having described the invention by the description and illustrations above, it should be understood that these are exemplary of the invention and are not to be considered as limiting. Accordingly, the invention is not to be considered as limited by the foregoing description, but includes any equivalent.

What is claimed is:

1. A method for manufacturing a SiC mixed trench Schottky diode comprising:
   providing a substrate and an epitaxial layer on top of the substrate;
   forming a plurality of trenches on a surface of the epitaxial layer;
   conducting P-type ion implantation at a bottom portion of each trench;
   conducting N-type ion implantation at sidewalls of each trench;
   forming an ohmic contact metal at a bottom portion of the Schottky diode;
   forming a Schottky contact metal on top of the epitaxial layer, and filling each of the trenches with the Schottky contact metal,
   wherein a first Schottky junction is formed between the Schottky contact metal and the epitaxial layer, and a second Schottky junction is formed between the trench and the epitaxial layer.

2. The method for manufacturing a SiC mixed trench Schottky diode of claim 1, wherein the substrate is an $N^+$ type SiC.

3. The method for manufacturing a SiC mixed trench Schottky diode of claim 1, wherein the ohmic contact metal includes nickel, silver and platinum.

4. The method for manufacturing a SiC mixed trench Schottky diode of claim 1, wherein the epitaxial layer is an N⁻ type SiC.

5. The method for manufacturing a SiC mixed trench Schottky diode of claim 1, wherein the step of forming a plurality of trenches on a surface of the epitaxial layer may include a step of etching the surface of the epitaxial layer by either dry etching or wet etching.

6. The method for manufacturing a SiC mixed trench Schottky diode of claim 5, wherein a depth of each trench is about 1 to 50000 angstrom.

7. The method for manufacturing a SiC mixed trench Schottky diode of claim 1, wherein the step of conducting ion implantation at a bottom portion of each trench may include a step of implanting P-type materials such as boron or aluminum into the bottom portion of the trench.

8. The method for manufacturing a SiC mixed trench Schottky diode of claim 7, wherein a thickness of the P-type implant is about 1 to 10000 angstrom.

9. The method for manufacturing a SiC mixed trench Schottky diode of claim 1, wherein the step of conducting ion implantation at sidewalls of each trench may include a step of implanting N-type materials such as nitrogen or phosphorus into at the sidewalls of the trench.

10. The method for manufacturing a SiC mixed trench Schottky diode of claim 9, wherein a thickness of the N-type implant is about 1 to 10000 angstrom.

11. A SiC mixed trench Schottky diode comprising an ohmic contact metal, a substrate made from N+SiC located on the top of said ohmic contact metal, an epitaxial layer produced from N⁻type SiC located on the top of said substrate, a trench produced by etching said epitaxial layer, a P-type implant formed in the bottom of said trench, an N-type implant formed in the side wall of said trench, a Schottky contact metal located on the top of said epitaxial layer, a Schottky junction being produced between said Schottky contact metal and said epitaxial layer, a second Schottky contact metal filled into said trench, for the purpose of introduce an additional low barrier Schottky junction between said trench layer and said epitaxial layer and a voltage reducing layer made from N-type impurity located in the side wall of said trench.

12. The SiC mixed trench Schottky diode of claim 11, wherein the depth of said trench is about 1 to 50000 angstrom.

13. The SiC mixed trench Schottky diode of claim 11, wherein the material of said P-type implant contains boron.

14. The SiC mixed trench Schottky diode of claim 11, wherein the material of said P-type implant contains aluminum.

15. The SiC mixed trench Schottky diode of claim 11, wherein the material of said N-type implant contains nitrogen.

16. The SiC mixed trench Schottky diode of claim 11, wherein the material of said N-type implant contains phosphorus.

17. The SiC mixed trench Schottky diode of claim 11, wherein the thickness of said N-type implant is about 1 to 10000 angstrom.

* * * * *